United States Patent
Uesawa

(10) Patent No.: US 6,177,233 B1
(45) Date of Patent: Jan. 23, 2001

(54) METHOD OF FORMING RESIST PATTERN

(75) Inventor: Fumikatsu Uesawa, Kanagawa (JP)

(73) Assignee: Sony Corporation, Tokyo (JP)

( * ) Notice: Under 35 U.S.C. 154(b), the term of this patent shall be extended for 0 days.

(21) Appl. No.: 09/386,001

(22) Filed: Aug. 30, 1999

(30) Foreign Application Priority Data

Sep. 3, 1998 (JP) .................................................. 10-249801

(51) Int. Cl.$^7$ .............................. G03F 7/30; G03F 7/38; G03F 7/20; G03C 5/56
(52) U.S. Cl. ..................... 430/290; 430/312; 430/311; 430/325; 430/327; 430/328; 430/396
(58) Field of Search ................................. 430/290, 312, 430/328, 327, 325, 311, 396

(56) References Cited

U.S. PATENT DOCUMENTS

| | | | |
|---|---|---|---|
| 5,234,780 | * | 8/1993 | Nitayama et al. ................... 430/290 |
| 5,407,786 | * | 4/1995 | Ito et al. ............................... 430/313 |
| 5,525,192 | * | 6/1996 | Lee et al. ............................. 430/313 |
| 5,858,621 | * | 1/1999 | Yu et al. ............................... 430/312 |
| 5,906,911 | * | 5/1999 | Cote ..................................... 430/312 |

OTHER PUBLICATIONS

Ki–Ho Baik et al., "Liquid phase silylation for the DESIRE process", SPIE vol. 1672 Advances in Resist Technology and Processing IX (1992), pp. 362–376.

* cited by examiner

Primary Examiner—Richard L. Schilling
(74) Attorney, Agent, or Firm—Ronald P. Kananen; Rader, Fishman & Grauer

(57) ABSTRACT

A method of forming a resist pattern comprising the steps of depositing a resist on a semiconductor substrate, performing a first exposure on the resist using a reticle with a certain pattern formed on it as a mask to change the degree of polymerization at the exposed area in the resist, causing diffusion of a silicon compound to silylate selectively a part of the surface of the resist, performing a second exposure on the resist so that light passing through the silylated area and the unsilylated area become inverse in phase, and developing the resist for forming a micropattern on the resist.

7 Claims, 2 Drawing Sheets

FIRST EXPOSURE

FIRST EXPOSURE

FIRST DEVELOPMENT $$\frac{\lambda}{2(n-1)}$$

SECOND EXPOSURE

SECOND DEVELOPMENT

FIRST EXPOSURE

SILYLATION $$\frac{\lambda}{2(n_1-n_2)}$$

SECOND EXPOSURE

DEVELOPMENT

METHOD OF FORMING RESIST PATTERN

BACKGROUND OF THE INVENTION

1. Field of the Invention

The present invention relates to a method of forming a resist pattern used for a photolithography process in the manufacture of a semiconductor device and, more particularly to a method of forming a resist pattern enabling formation of a fine pattern realizing a resolution higher than the resolution limit determined by the exposure wavelength.

2. Description of the Related Art

In recent years, the semiconductor industry has developed rapidly—with the degree of integration, in semiconductor devices quadrupling every three years. Higher integration of semiconductor devices has been achieved by reducing the minimum line width of the circuit constructing an LSI by 70 percent every generation, that is, from 0.5 $\mu$m to 0.35 $\mu$m and to 0.25 $\mu$m. However, as a result of this miniaturization of semiconductor devices, it has become difficult to maintain a high resolution in processes using photolithography.

Generally, the resolution in photolithography is determined by the equation below in which $\lambda$ represents the wavelength of a light source and NA represents the numerical aperture, $$\text{Resolution} = \alpha \times (\lambda/\text{NA}) \tag{1}$$

(where, $\alpha$ represents the process coefficient determined by the resist and other conditions and having a value of usually about 0.5).

The numerical aperture (NA) of a projection optical system is usually 0.5 to 0.6; thus, the limit of resolution in photolithography is about the wavelength of the light source. It is possible to use a KrF exciter laser (248 nm in wavelength) for producing 0.25 $\mu$m line width generation LSIs. For the next 0.18 $\mu$m generation or 0.13 $\mu$m generation, even when using an ArF excimer laser (193 nm in wavelength) as a light source, there are problems such as the lack of sufficient study of suitable resist materials. At the present time, no promising photolithographic technology for the shorter wavelength has been developed.

The phase shifting technology has been proposed as a means for solving the problem of the resolution being limited to the wavelength of the light source for exposure. According to the phase shifting technique, light passing through adjoining apertures on a mask are shifted in phase by 180° from each other so as to enable formation of fine patterns with a resolution higher than the value obtained in the above equation (1).

In the conventional phase shifting technology, a microstructure referred to as a "phase shifter" was introduced in a reticle or mask and the phase inverted on the mask. A mask having such a phase shifter is generally difficult to produce. Moreover, there is the problem that no effective methods have been studied for inspecting for defects in the produced mask or repairing defects. Due to this, phase, shifting technology has been slow to be commercialized and has not yet been applied to mass production despite its potential advantages.

The principle of the phase shifting technology, however, is to shift the phases of adjacent light by 180°. If a phase shifter can be provided anywhere in the optical path, it is not necessary to position the phase shifter on the mask.

From this point of view, as lithographic techniques not providing phase shifters on the mask but giving the resist the function of phase shifters, there are the methods of forming patterns disclosed in Japanese Unexamined Patent Publication (Kokai) No. 5-198491 and No. 6-13309.

The conventional methods of forming a pattern disclosed in the above publications will be explained below with reference to FIGS. 1A to 1D. These methods employ a two-layer resist process. First, as shown in FIG. 1A, a lower resist 2 and an upper resist 3 are deposited on a semiconductor substrate 1. The upper resist 3 is coated with a thickness by which the phase difference between light passing through the upper resist 3 and light passing outside the resist 3 becomes 180°. That is, the thickness $d_a$ of the upper resist is determined based on $$d_a = \lambda / \{2(n-1)\} \tag{2}$$

in which n represents the refractive index of the upper resist.

Next, as shown in FIG. 1A, using a reticle 41 as a mask, first exposure Is performed to form a pattern on the upper resist 3 with about the same resolution as the resolution limit of the optical system. At that time, by using a resist for a KrF laser as the upper resist 3 and using a resist for i-line as the lower resist 2 and by using a KrF laser as a light source, the lower resist 2 is not exposed because it has no sensitivity to the light of the first exposure.

As shown in FIG. 1B, after the first exposure, first development is performed to pattern the upper resist 3.

Next, as shown in FIG. 1C, second exposure is performed over the entire surface at a wavelength to which the lower resist 2 has sensitivity. At this time, the pattern of the upper resist 3 formed by the first exposure functions as a phase shifter. Therefore, the intensity of light becomes zero at the edge of the upper resist pattern due to interference. The principle is the same as that of the "chrome-less" phase shifting technique.

Further, if the entire surface is exposed by light of a wavelength to which the upper resist 3 has sensitivity, the upper resist 3 functioning as a phases shifter becomes completely exposed and can be dissolved in the developing solution. If the upper resist 3 and the lower resist 2 are exposed at the same time, as mentioned above, only the lower resist 2 at the edge of the shifter where the intensity of light becomes zero remains.

According to the above method of forming a pattern, it is possible to form a micropattern of a resolution higher than the resolution limit determined by the wavelength of exposure without using a phase shifting mask (1,1, a mask comprising a phase shifter).

Summarizing the problems to be solved by the invention, there are few resist materials in the commercially available resist materials which are suitable for the above conventional method using two-layer resists.

In the two-layer resist process, a silicon-containing resist is often used as the upper resist. When using an upper resist containing silicon, high content of silicon is required in order to secure a sufficient selectivity between the upper resist and the lower resist when transferring the pattern of the upper resist to the lower resist in the second exposure. As a result, the resolution and other characteristics of the resist are sometimes impaired.

On the other hand, even when not using a silicon-containing resist as the upper resist, there are problems. In the two-layer resist process, the upper resist is formed thinly with the object of improving the transparency and the resolution of the upper resist and with the object of increasing the depth of focus when exposing the lower resist. The resist materials tend to dissolve into each other at the interface between the upper resist and the lower resist. In particular, when the upper resist is made thin, the resolution can fall depending on the combination of resist materials.

SUMMARY OF THE INVENTION

An object of the present invention is to provide a method of forming a resist pattern enabling formation of a fine pattern realizing a resolution higher than the resolution limit determined by the exposure wavelength.

According to the present invention, there is provided a method of forming a resist pattern comprising the steps of depositing a resist on a semiconductor substrate, performing a first exposure on the resist using a reticle with a certain pattern formed on it as a mask to change the degree of polymerization at the exposed area in the resist, diffusing a silicon compound in the resist to silylate selectively a part of the surface of the resist, performing a second exposure on the resist so that the phases of the light passing through the silylated areas and the unsilylated areas become inverted, and developing the resist to form a micropattern of the resist.

Preferably, the step of silylating the resist is a step of silylating the resist selectively at the area exposed in the first exposure.

Alternatively, the step of silylating the resist is a step of silylating the resist selectively at the area unexposed in the first exposure.

Preferably, the step of silylating the resist is a step of silylating the surface of the resist so that a thickness d of the silylated area becomes $$d=\lambda/\{2(n_1-n_2)\}$$

in which $\lambda$ represents the exposure wavelength, $n_1$ represents the refractive index of the resist before silylation, and $n_2$ represents the refractive index of the resist after silylation.

Preferably, the step of silylating the resist is a step of causing diffusion of a silicon compound in the resist in a gas phase.

Alternatively, the step of silylating the resist is a step of causing diffusion of a silicon compound in the resist in a liquid phase.

Preferably, the silicon compound used for the silylation is selected from a group comprising hexamethyl disilazane, tetramethyl disilazane, bis(dimethylamino) dimethylsilane, dimethylsilyldimethylamlne, and N,N-dimethylamino trimethylsilane.

According to the above method, since the light passing through the silylated area of the resist surface and the light passing through the unsilylated area are inverse in phase and interfere with each other, the intensity of the light at the interface between the silylated area and the unsilylated area becomes zero and a micropattern is formed in the resist. When exposing without phase shifting, the resolution limit is about the exposure wavelength, but according to the method of forming a resist pattern of the present invention, a resolution higher than the resolution limit determined by the exposure wavelength can be obtained.

In the conventional method of forming a resist pattern using the two-layer resist process, there was a problem that the resolution declined due to the resists at the interface between the upper resist and the lower resist dissolving into each other, but according to the method of the present invention, since a single resist layer is used, the decline of the resolution due to the mixing of the resist materials can be prevented.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

In the conventional method of forming a resist pattern functioning as a phase shifter, a multilayer resist process was applied. In contrast, according to the method of forming a resist pattern of the present invention, by employing the surface silylation technique, it becomes possible to form a pattern with a high resolution with a single layer of resist.

Below, preferred embodiments will be described with reference to the accompanying drawings.

Figure 1A:
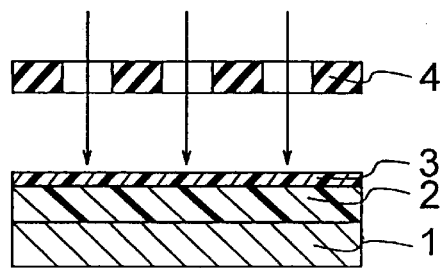
FIGS. 1A to 1D are cross-sectional views describing the steps of forming a resist pattern in a conventional method and FIGS. 2A to 2D are cross-sectional views describing the steps of forming a resist pattern of the present invention.
Figure 1B:
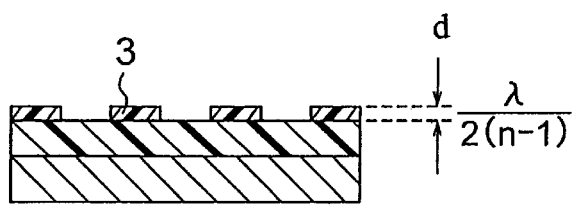
Figure 1C:
Figure 1C:
Figure 1D:
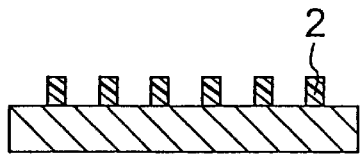
Figure 2A:
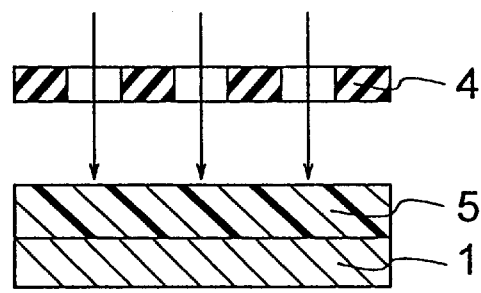

First, as shown in FIG. 2A, a resist 5 is deposited on a semiconductor substrate 1. Using a reticle 4 as a mask, a first exposure is performed to form a latent image of about the resolution limit on the surface of the resist 5. For example, using a PVP (polyvinyl phenol) based resist for a KrF excimer laser for the resist 5 and using an ArF excimer laser as a source of light for the first exposure, a photo-crosslinking reaction is induced in the exposed surface areas leading to an increase in molecular weight. Light from an ArF excimer laser does not pass through a PVP-based resin, therefore no chemical reaction arises such as that with exposure by a KrF laser.

Figure 2B:
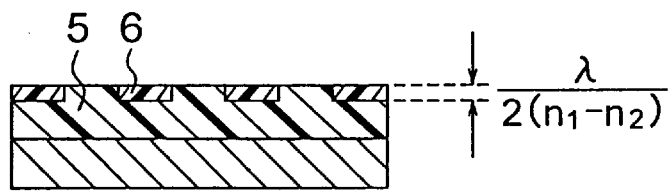

Next, as shown in FIG. 2B, silylation is performed in the gas or liquid phase. In the exposed areas on the surface of the resist 5, diffusion of the silylating agent is inhibited because of the increase in molecular weight of the resin. Therefore, the unexposed areas 6 are selectively silylated. The refractive index of the unsilylated resist $n_1$ and that of silylated resist $n_2$ are determined in advance and the silylation is carried out so that the thickness d of the silylated areas 6 becomes:

$$d=\lambda/\{2(n_1-n_2)\} \qquad (3)$$

When using a PVP-based resin as the resist 5, Si bonds with the phenolic hydroxyl group of the PVP-based resin due to the silylation process. The silylating agent can be selected from the group comprising, for example, hexamethyl disilazane, tetramethyl disilazane, bis(dimethylamino) dimethylsilane, dimethylsilyldimethylamine, N,N-dimethylamino trimethylsilane, etc. and the like.

In particular, by using hexamethyl disilazane or tetramethyl disilazane for the gas phase silylation process and by using bis(dimethylamino) dimethylsilane for the liquid phase silylation process, it is possible to perform silylation with highly controlled pattern (Optical functions Film Ki-Ho Baik et al., SPIE Vol. 1672 *Advances in Resist Technology and Processing* IX (1992)).

In the gas phase silylation process, generally, the silylation is performed under conditions of a temperature below 200° C., for example, 140 to 180° C., for 1 to 3 minutes, in consideration of the heat resistance of the resist material. When using hexamethyl disilazane, it is necessary to heat to above 190° C., while when using tetramethyl disilazane, it is possible to perform silylation at a lower temperature.

The liquid phase silylation process is performed at room temperature or by heating. The reaction temperature is set in accordance with the silylating agent. N-methyl-2-pyrrolidone is added as a diffusion promotor for the silylating agent and xylene, for example, is used as solvent, to perform the silylation. Generally, heat treatment is performed at 170° C. for 2 minutes, for example, in the air before liquid phase silylation process as a presilylation bake (PSB) step. After the liquid phase silylation process, an after bake step is performed at 90° C. for 1 minute, for example.

Figure 2C:
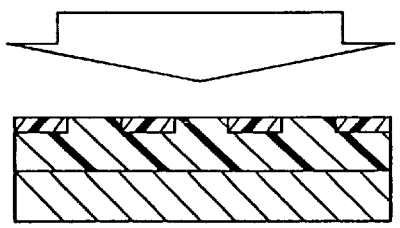

Next, as shown in FIG. 2C, exposure is performed over the entire surface using a KrF laser. The intensity of the light becomes zero at the edge of the silylated areas 6 due to interference of light, while the other areas of the resist 5 are not exposed. The other areas of the resist 5 are developed and become soluble.

Figure 2D:
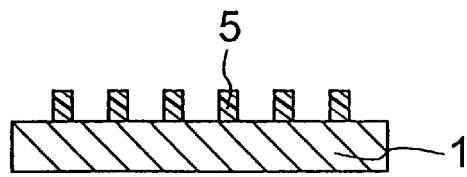

Consequently, as shown in FIG. 2D, only the resist 5 at the edges of the silylated areas 6 remains and a submicron pattern with an improved resolution limit is formed.

The patterned resist 5 is then used as a mask for the underlying semiconductor substrate 1, then can be removed by plasma ashing or by using a resist remover/washing solution (EKC270™ of EKC Technology Inc., for example). By using the resist 5 having the micropattern as a mask, it is possible to perform microprocessing on the underlying semiconductor substrate 1. Therefore, the degree of integration in a semiconductor device can be improved.

According to the method of forming a resist pattern of the present embodiment, it is possible to form a micropattern with a high resolution on a resist based on a principle of phase shifting technique without the resolution limit depending on the wavelength of the exposure light source.

The method of forming a resist pattern of the present invention is not limited to the above embodiment. For example, while a positive resist is used as the resist 5 in the above embodiment, it is also possible to use a negative resist instead of the positive resist and removing the resist selectively at the edge of the silylated areas 6.

It is also possible to silylate the exposed areas selectively by the first exposure process, instead of silylating the surface of the resist in the unexposed areas by the first exposure process as described in the above embodiment. For example, by using a novolak resin as a resist and performing a presilylation bake after the first exposure for thermal polymerization of the resist at the unexposed areas, the diffusion of the silylating agent into the unexposed areas can be suppressed and therefore it is possible to selectively silylate only the areas irradiated in the first exposure process.

In addition, various modifications may be made within a range not outside the gist of the present invention.

Summarizing the effects of the invention, according to the method of forming a resist pattern of the present invention, the same effect can be obtained as the conventional phase shifting technique without using a mask (reticle) having a phase shifter. That is, the resolution limit is not determined by the wavelength of the projection light source, and it is possible to form a micropattern with a high resolution.

What is claimed is:

1. A method of forming a resist pattern comprising the steps of:

depositing a resist on a semiconductor substrate;

performing a first exposure on the resist using a reticle with a certain pattern formed on the reticle as a mask to change the degree of polymerization at the exposed area in the resist;

causing diffusion of a silicon compound into the resist to silylate selectively a part of the surface of the resist;

performing a second exposure on the resist so that light passing through the silylated area and the unsilylated area become inverse in phase; and developing the resist to form a micropattern on the resist.

2. A method of forming a resist pattern as set forth in claim 1, wherein the step of silylating the resist is a step of silylating the resist selectively at the area exposed in the first exposure.

3. A method of forming a resist pattern as set forth in claim 1, wherein the step of silylating the resist is a step of silylating the resist selectively at the area unexposed in the first exposure.

4. A method of forming a resist pattern as set forth in claim 1, wherein the step of silylating the resist is a step of silylating the surface of the resist to give a thickness d of the silylated area of $$d=\lambda/\{2(n_1-n_2)\}$$

in which $\lambda$ represents the exposure wavelength, $n_1$ represents the refractive index of the resist before silylation, and $n_2$ represents the refractive index of the resist after silylation.

5. A method of forming a resist pattern as set forth In claim 1, wherein the step of silylating the resist is a step of diffusing the silicon compound in a gas phase.

6. A method of forming a resist pattern as set forth in claim 1, wherein the step of silylating the resist is a step of diffusing the silicon compound in a liquid phase.

7. A method of forming a resist pattern as set forth in claim 1, wherein the silicon compound used for the silylation is selected from a group comprising hexamethyl disilazane, tetramethyl disilazane, bis(dimethylamino) dimethylsilane, dimethylsilyldimethylamine, and N,N-dimethylamino trimethylsilane.

* * * * *